(12) United States Patent
Kang (10) Patent No.: US 7,755,963 B2
(45) Date of Patent: Jul. 13, 2010

(54) SENSE AMPLIFIER AND DRIVING METHOD THEREOF, AND SEMICONDUCTOR MEMORY DEVICE HAVING THE SENSE AMPLIFIER

(75) Inventor: Hee Bok Kang, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 162 days.

(21) Appl. No.: 12/046,787

(22) Filed: Mar. 12, 2008

(65) Prior Publication Data

US 2009/0147604 A1 Jun. 11, 2009

(30) Foreign Application Priority Data

Dec. 5, 2007 (KR) ...................... 10-2007-0125389

(51) Int. Cl.
*G11C 7/02* (2006.01)
(52) U.S. Cl. ........................ 365/207; 365/205; 365/203
(58) Field of Classification Search ................. 365/207, 365/205, 203
See application file for complete search history.

(56) References Cited

U.S. PATENT DOCUMENTS 5,982,690 A * 11/1999 Austin ........................ 365/205
6,633,188 B1 * 10/2003 Jia et al. ..................... 327/217
6,819,144 B2 * 11/2004 Li et al. ........................ 327/55
7,095,668 B2 * 8/2006 Cho ............................ 365/207

FOREIGN PATENT DOCUMENTS

| KR | 2007-84785 A | 8/2007 |
|---|---|---|
| KR | 1020070096506 A | 10/2007 |
| KR | 1020070097804 A | 10/2007 |

* cited by examiner

*Primary Examiner*—Anh Phung
(74) *Attorney, Agent, or Firm*—Ladas & Parry LLP

(57) ABSTRACT

The semiconductor memory device includes a bank having a cell array and a sense amplifier. A back bias voltage generating unit supplies a back bias voltage to the cell array of the bank. A negative drive voltage generating unit generates negative driving voltages including a normal pull-up voltage, an overdrive voltage, a normal pull-down voltage, and a negative voltage and supplies the negative driving voltages to the sense amplifier of the bank. A switching unit opens a connection between the back bias voltage generating unit and the negative drive voltage generating unit when in active mode and shares the back bias voltage between the back bias voltage generating unit and the negative drive voltage generating unit when in a refresh mode, in response to an external command.

6 Claims, 6 Drawing Sheets

SENSE AMPLIFIER AND DRIVING METHOD THEREOF, AND SEMICONDUCTOR MEMORY DEVICE HAVING THE SENSE AMPLIFIER

CROSS-REFERENCE TO RELATED APPLICATIONS

The present application claims priority to Korean patent application number 10-2007-0125389 filed on Dec. 5, 2006 which is incorporated herein by reference in its entirety.

BACKGROUND OF THE INVENTION

The present invention relates generally to a semiconductor memory device, and more particularly to a sense amplifier performing a negative drive, a driving method of the sense amplifier performing a pull-down drive by a negative voltage, and a semiconductor memory device having the sense amplifier.

The data to be stored in a cell array or the data stored in the cell array is carried on a bit line of the semiconductor memory device. The data delivered between the bit line and a data bus is sensed and amplified by a sense amplifier.

Figure 1A:
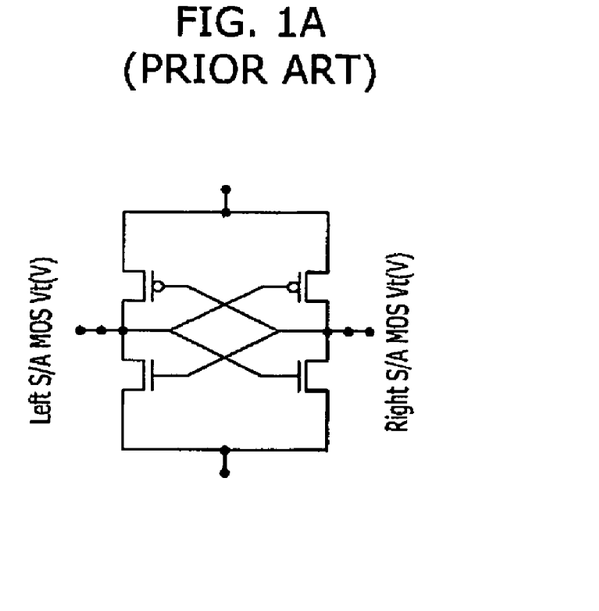
FIG. 1a is a circuit diagram showing a cross-coupled latch-type sense amplifier.
Figure 1B:
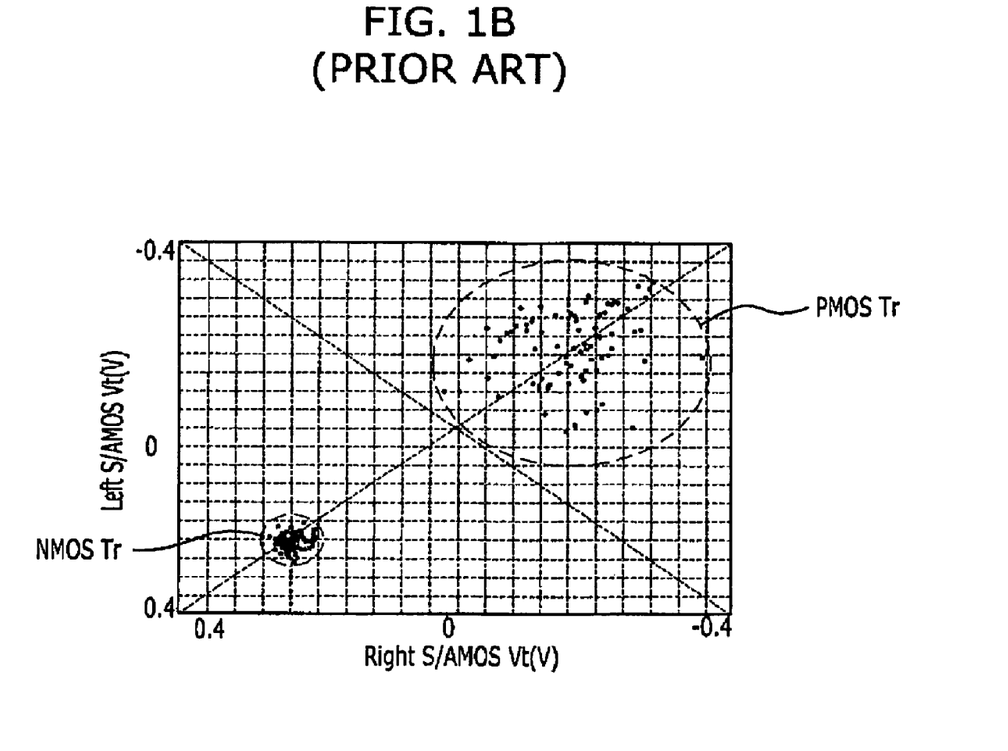

The structure of a cross-coupled latch-type sense amplifier is shown in FIG. 1a. FIG. 1B shows the threshold voltage offset characteristic of a NMOS transistor and a PMOS transistor provided in the sense amplifier of FIG. 1a.

In FIG. 1b, the X-axis indicates the threshold voltage value Vt of the NMOS transistor and the PMOS transistor located on the right-side of the sense amplifier shown in FIG. 1a. The Y axis indicates the threshold voltage value Vt of the NMOS transistor and the PMOS transistor located on the left-side of the sense amplifier shown in FIG. 1a. FIG. 1b shows a threshold voltage characteristic wherein the threshold voltage value measured for the NMOS transistors and PMOS transistors of multiple sense amplifiers is displayed on a coordinate point.

Referring to FIG. 1b, the NMOS transistors display a uniform distribution of threshold voltage values, while the PMOS transistors display a nonuniform distribution of threshold voltage values since a threshold voltage characteristic is distributed.

Figure 2:
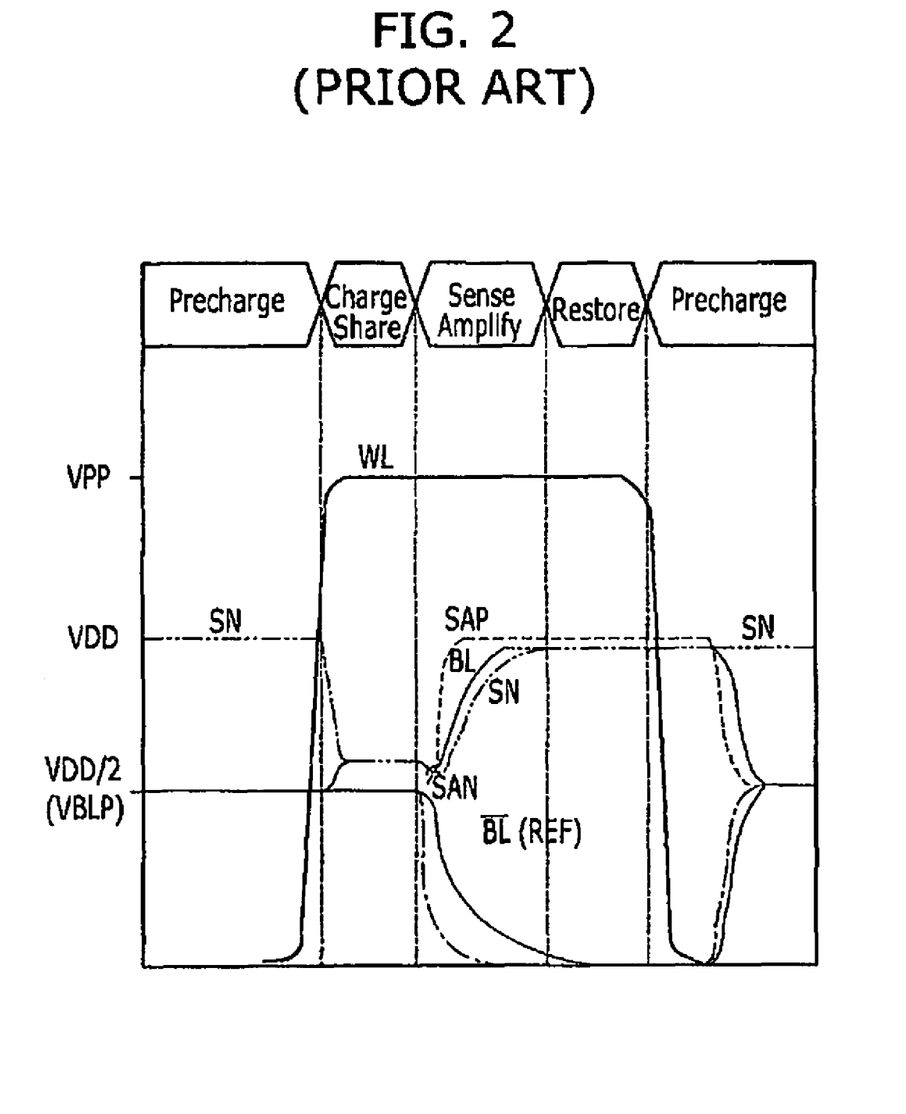
FIG. 2 is an operational timing diagram showing the sense amplifier of FIG. 1.

As previously stated, FIG. 1a shows the sense amplifier which senses and amplifies a voltage on the bit line associated with a cell array. FIG. 2 shows an operational timing diagram of the sense amplifier.

Referring to FIG. 2, in a precharge section, the bit lines BL, /BL and sense amplifier driving signals SAP, SAN have a bit line precharge voltage VBLP. The bit line precharge voltage VBLP is defined as ½ of the power supply voltage VDD, which is the high voltage of the cell.

In the charge share section, the word line WL is activated with the high voltage VPP so that the data of the cell is carried on the bit line BL.

In the sense amplifying section, in order to amplify the signal of the bit lines BL, /BL, the pull-down driving signal SAN transits to a ground voltage, and the pull-up driving signal SAP transits to the power supply voltage VDD. Therefore, the bit lines BL, /BL are amplified to the power supply voltage VDD and the ground voltage respectively.

In the restore section, the amplified signals on the bit lines BL, /BL are rewritten in the cell. Upon completion of restoring the data, the sense amplifying circuit 24 is returned to the precharge state.

The symbol SN is a storage node voltage and the symbol REF is a reference voltage applied to the bit line /BL if the data is carried on the bit line BL.

However, the semiconductor memory device described above causes the margin of the operation voltage for the threshold voltage to be reduced if the operation voltage is lowered, thereby deteriorating the operational characteristics of the sense amplifier.

Particularly, the threshed voltage difference between the PMOS transistors of the sense amplifier is larger than the threshold voltage difference between the NMOS transistors of the sense amplifier, as is shown in FIG. 1b. Therefore, the offset voltage amplified by the PMOS transistor is considerably larger than the offset voltage amplified by the NMOS transistor.

In the above described sense amplifier having the threshold voltage distribution characteristic shown in FIG. 1b, since the amplification driving capability is reduced if the operation voltage is lowered, the difference between the offset voltages becomes an important factor which influences the driving capability of the sense amplifier as the operation voltage is lowered.

Typically, the sense amplifier uses a voltage larger than the high voltage on the bit line in an overdrive manner in order to improve the driving capability of the PMOS transistor. However, a problem occurs which causes a data error in the output of the sense amplifier due to the great influence of the offset characteristic of the PMOS transistor.

SUMMARY OF THE INVENTION

The present invention provides a sense amplifier having a sufficient driving capability without being influenced by the offset property of a low voltage operation, and a driving method thereof.

Further, the present invention provides a semiconductor memory device having sufficient driving capability for an active operation including an offset negative drive and a refresh operation performing successive active operations on banks.

A semiconductor memory device according to the present invention comprises a bank having a cell array and a sense amplifier; a back bias voltage generating unit supplying a back bias voltage provided to the cell array of the bank; a negative drive voltage generating unit generating and providing negative driving voltages including a normal pull-up voltage, an overdrive voltage, a normal pull-down voltage, and a negative voltage as a voltage having a level the same as the level of the back bias voltage to the sense amplifier of the bank in accordance with an external command indicating an active mode or a refresh mode; a switching unit opening a connection between the back bias voltage generating unit and the negative drive voltage generating unit when in the active mode and sharing the back bias voltage between the back bias voltage generating unit and the negative drive voltage generating unit when in the refresh mode.

A sense amplifier according to the present invention comprises a sense amplifier drive unit having a sense amplifying circuit including a pull-up activating terminal and a pull-down activating terminal, wherein the sense amplifying circuit performs a pull-up drive by a voltage applied to the pull-up activating terminal and a pull-down drive by a voltage applied to the pull-down activating terminal; a sense amplifier drive controller comprising a pull-up drive controller sequentially applying a normal pull-up voltage and an overdrive voltage having a voltage level higher than that of the normal pull-up voltage to the pull-up activating terminal; a pull-down controller applying a normal pull-down voltage to the pull-down activating terminal and applying a negative voltage having a voltage level less than that of the normal pull-down voltage to the pull-down activating terminal for a predetermined period of time while applying the normal pull-down voltage, wherein the overdrive voltage is supplied after applying the negative voltage.

Preferably, the pull-up drive control unit comprises a first switching element switching a core voltage supplied as the normal pull-up voltage and a second switching element switching a power supply voltage supplied as the overdrive voltage; and the pull-down drive control unit comprises a third switching element switching a back bias voltage supplied as the normal pull-down voltage and a fourth switching element switching the negative voltage.

A driving method of a sense amplifier according to the present invention comprising steps of activating a word line after a precharge period so that cell data is carried on a bit line; driving the sense amplifier in a normal pull-down drive by applying a normal pull-down voltage to a pull-down activating terminal of the sense amplifier; driving the sense amplifier in a negative pull-down drive by applying a negative voltage having a voltage level less than that of the normal pull-down voltage to a pull-down activating terminal of the sense amplifier driven in the normal pull-down operation; overdriving the sense amplifier by applying the overdrive voltage of level higher than that of the normal pull-up voltage to a pull-up activating terminal of the sense amplifier in a state where the sense amplifier is driven in the negative pull-down operation; changing the sense amplifier into the normal pull-down state by applying the normal pull-down voltage to the pull-down activating terminal of the sense amplifier driven in the negative pull-down operation; changing the sense amplifier to the normal pull-up drive state by applying the normal pull-up voltage to the pull-up activating terminal of the overdriven sense amplifier overdriven; and returning to the precharge state after remaining in the normal pull-down drive state and the normal pull-up drive state for a predetermined period of time.

Preferably, a power supply voltage or a high voltage is supplied as the overdrive voltage, the core voltage is supplied as the normal pull-up voltage, and the back bias voltage is supplied as the normal pull-down voltage.

According to the present invention, the sense amplifier can sense data without being influenced by the offset characteristic by performing the negative pull down drive and the overdrive.

Further, the semiconductor memory device according to the present invention can compensate driving capability by causing the negative drive voltage generating unit to supply driving voltage to the sense amplifier independently during an active operation and sharing voltage having the same voltage level with the back bias voltage generating unit (which provides back bias to the cell array) in the refresh mode where driving voltage is largely consumed due to successive active operations.

Additionally, the semiconductor memory device according to the present invention improves driving capability without increasing the layout of the semiconductor memory device by compensating driving capability by sharing the voltage between a back bias voltage generating unit and a negative voltage generating unit.

BRIEF DESCRIPTION OF THE DRAWINGS

FIG. 1b is a graph illustrating a threshold voltage offset characteristic of NMOS transistor and PMOS transistor provided in the sense amplifier of FIG. 1a.

DESCRIPTION OF SPECIFIC EMBODIMENTS

Hereinafter, preferred embodiments of the present invention will be described in detail with reference to the accompanying drawings.

Figure 3:
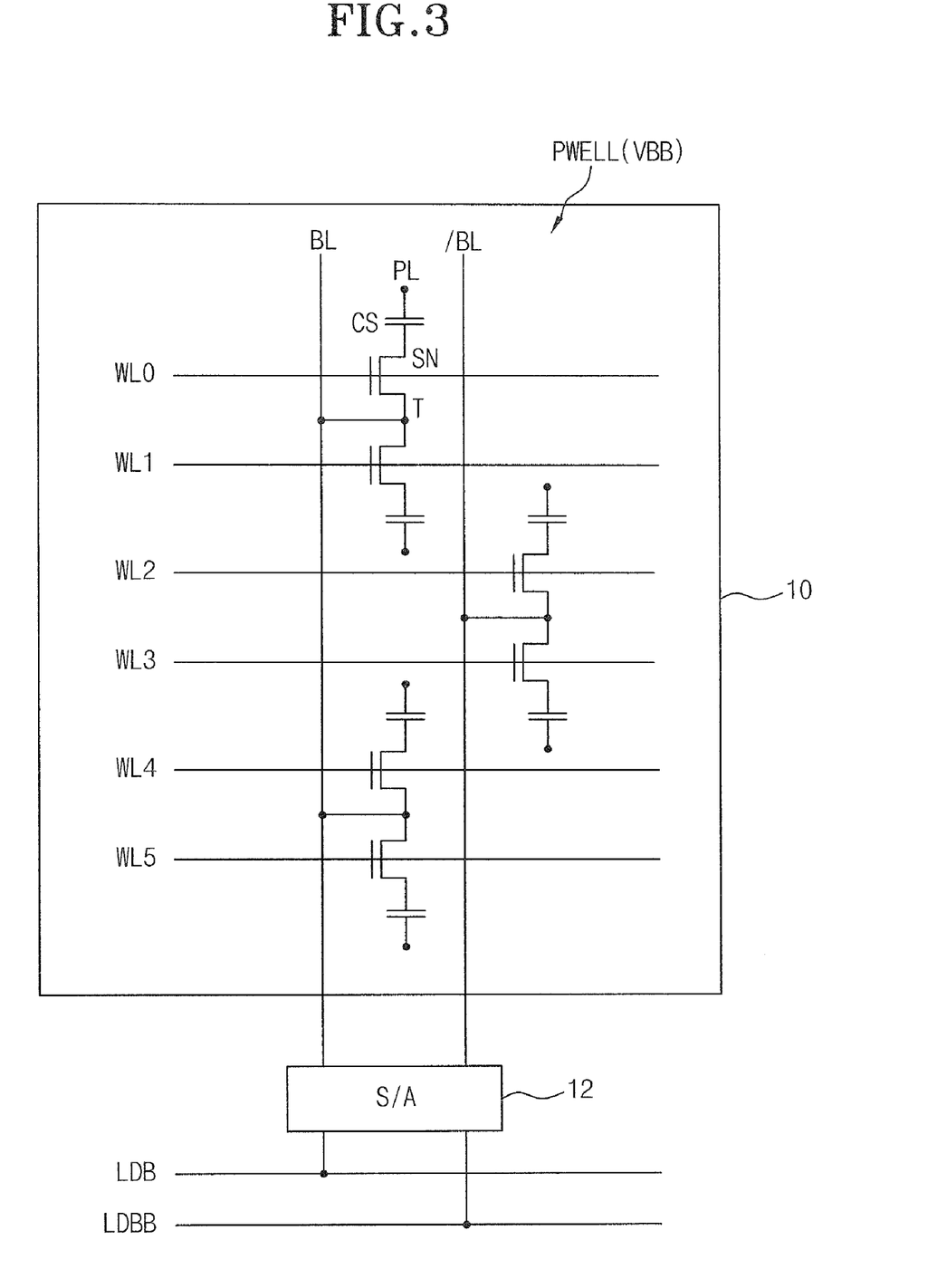
FIG. 3 is a diagram showing a cell array and a sensing related block according to the present invention.

FIG. 3 is a diagram showing a cell array 10 and a sensing related block. The present invention exemplifies a cell array 10 having a folded bit line structure and a latch-type sense amplifier 12.

The cell array 10 includes DRAM cells each composed of one NMOS transistor T and one capacitor CS that is adjusted by a word line WL. Each cell in the cell array corresponds to one of the word lines WL0, WL1, WL2, WL3, WL4, and WL5. The drain of the NMOS transistor T of a cell is connected to the bit line BL, /BL, and the source is connected to an electrode of the corresponding capacitor CS. The node at the connection between the NMOS transistor T1 and the capacitor CS is defined as a storage node SN and the storage node SN includes the charge written to the cell as data. The node of the capacitor CS opposite the storage node SN functions as a plate electrode and is connected to the cell plate PL. The cell plate PL is common to other cells, and a cell plate voltage is applied to the cell plate PL. The cell plate voltage is defined as ½ of the power supply voltage VDD, and the power supply voltage VDD is defined as a high operation voltage of the cell. A negative back bias voltage VBB is supplied as the PMOS well voltage of the cell array 10.

The latch-type sense amplifier 12 has output terminals connected to the bit lines BL, /BL. When a word line WL is activated in order to deliver the appropriate cell data to the bit line BL, a reference voltage is supplied to the bit line /BL. In contrast, when a word line WL is activated to in order to delivered the appropriate cell data to the bit line /BL, the reference voltage is supplied to the bit line BL. The sense amplifier 12 performs data delivery between the bit lines BL, /BL and the local data input/output lines LDB, LDBB.

Figure 4:
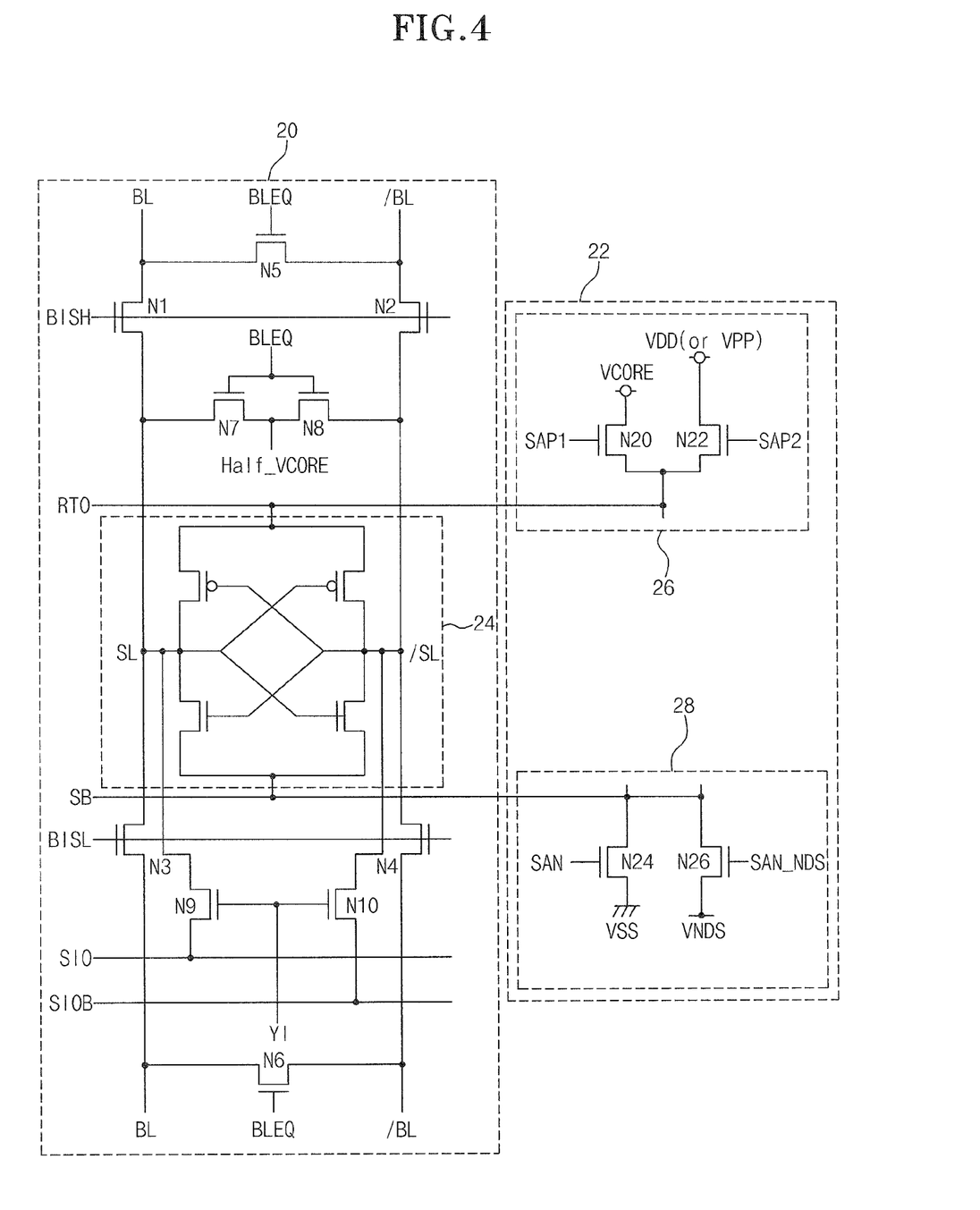
FIG. 4 is a detailed circuit diagram illustrating an embodiment according to the present invention.

FIG. 4 shows a sense amplifier drive unit 20 and a sense amplifier drive controller 22 included in the sense amplifier 12 of the present invention. The sense amplifier drive unit 20 includes a latch-type sense amplifier circuit 24, and the sense amplifier drive controller 22 includes a pull-up drive controller 26 and a pull-down driving controller 28.

The pull-up drive controller 26 provides core voltage Vcore for normal pull-up driving and provides power supply voltage VDD or high voltage VPP, for selective overdrive driving, to a pull-up activating terminal RTO of the sense amplifying circuit 24. The pull-down drive controller 28 provides a ground voltage VSS for normal pull-down driving and provides a negative voltage VNDS, for selective negative driving, to the pull-down activating terminal SB of the sense amplifying circuit 24.

The structure of the sense amplifier drive unit 20 will now be described. In the sense amplifier drive unit 20, bit line select transistors N1, N2, N3, and N4 are provided on the bit lines BL in order to selectively connect the sense amplifying circuit 24 to an upper part or a lower part of the cell array using the bit line select signals BISH, BISL. Further, equalizing transistors N5, N6 are connected to the bit lines BL, /BL outside of the bit line select transistors N1, N2, N3 and N4 in order to equalize the bit lines BL, /BL and are controlled by a bit line equalizing signal BLEQ. The sense amplifying circuit 24 is provided between the bit line select transistors N1, N2 and N3, N4.

Precharge transistors N7 and N8 used for precharging are connected in series between the sense amplifying circuit 24 and the bit line select transistors N1 and N2. The half core voltage Half-Vcore is applied to the node between the precharge transistors N7 and N8 connected in series, and the bit line equalizing signal BLEQ is applied to the gate of each precharge transistor N7 and N8.

Further, the output terminals SL and /SL of the sense amplifying circuit 24 are controllably connected to the sub input/output lines SIO, SIOB, which correspond to the local input/output lines LDB, LDBB of FIG. 3, by the column select transistors N9 and N10. The column select transistors N9 and N10 are controlled by the column select signal YI commonly applied to the gates thereof.

As previously mentioned, the bit line equalizing signal BLEQ controls the supply of the half-core voltage Half-VCORE for precharging the bit lines BL, /BL. The half-core voltage Half-Vcore is defined as ½ of the core voltage VCORE.

The data input/output between the sense amplifying circuit 24 and the sub input/output lines SIO, SIOB is controlled by the column select signal YI, and the data exchange between the sense amplifying circuit 24 and the cell array is controlled by the bit line select signals BISH, BISL.

The sense amplifier drive controller 22 comprises a pull-up drive controller 26 and a pull-down drive controller 28. The pull-up drive controller 26 comprises a NMOS element N20 supplying the core voltage VCORE which is a high voltage of the bit lines BL, /BL, and a NMOS element N22 supplying a power supply voltage VDD which is the supply voltage of the semiconductor memory device and a high voltage VPP boosted above VDD as a voltage for the overdrive. The NMOS element N20 is driven by the normal pull-up control signal SAP1, and the NMOS element N22 is driven by the overdrive control signal SAP2. The pull-down drive controller 28 comprises a NMOS element N24 supplying the ground voltage VSS to the bit lines BL, /BL and a NMOS element N26 supplying a negative voltage VNDS which is pumped lower than the ground voltage VSS. Herein, the NMOS element N24 is driven by the normal pull-down control signal SAN, and the NMOS element N26 is driven by the negative drive control signal SAN_NDS.

Figure 5:
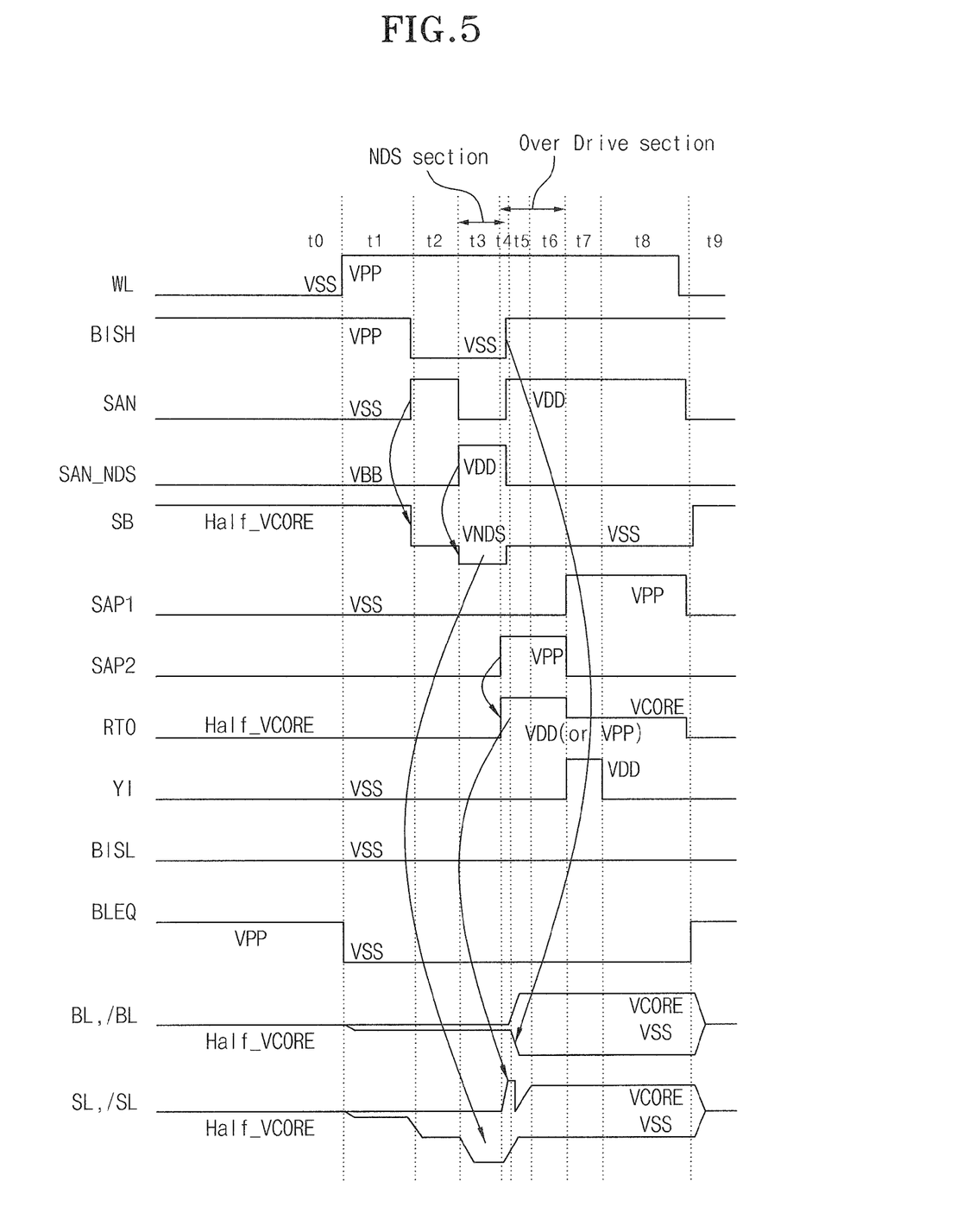
FIG. 5 is a timing diagram illustrating an embodiment according to a driving method of the sense amplifier of the present invention.

Referring to FIG. 5, the operations of the sense amplifier in FIG. 4 will be described for time period sections t0-t9.

The first section t0 and the tenth section t9 are precharge sections, in which the bit lines BL, /BL; the pull-up activating terminal RTO; and the pull-down activating terminal SB are precharged with the half-core voltage HALF-VCORE.

In the second section t1, the word line WL is activated so that the cell data is carried on the bit line BL, and the reference voltage REF is applied to the bit line /BL. On the other hand, if the cell data is carried on the bit line /BL, the reference voltage REF is applied to the bit line BL.

In the third section t2, the normal control signal SAN is activated so that the pull-down activating terminal SB transits to the ground voltage VSS.

In the fourth section t3, negative drive control signal SAN_NDS is activated so that the pull-down activating terminal SB descends to the negative drive voltage VNDS before the fifth section t4.

The overdrive control signal SAP2 is activated in the fifth section t4, so that the PMOS transistor of the sense amplifying circuit 24 is overdriven during the fifth through seventh sections t4-t6.

During the eighth section t7 and the ninth section t8, the normal pull-up control signal SAP1 is activated so that the core voltage VCORE is supplied to the sense amplifying circuit 24.

The negative drive and the overdrive drive overlap in the fifth section t4. Therefore, the output terminals SL, /SL of the sense amplifying circuit 24 are amplified to the negative voltage VNDS and the power supply voltage VDD or the high voltage VPP. At this time, the bit line select signal BISH is in an off-state, and therefore the bit lines BL, /BL are not influenced by the voltage amplified in the output terminals SL, /SL of the sense amplifying circuit 24.

The bit line select signal BISH is boosted to the high voltage VPP in the sixth section t5, so that the voltage amplified in the sense amplifying circuit 24 is delivered to the bit lines BL, /BL.

Figure 6:
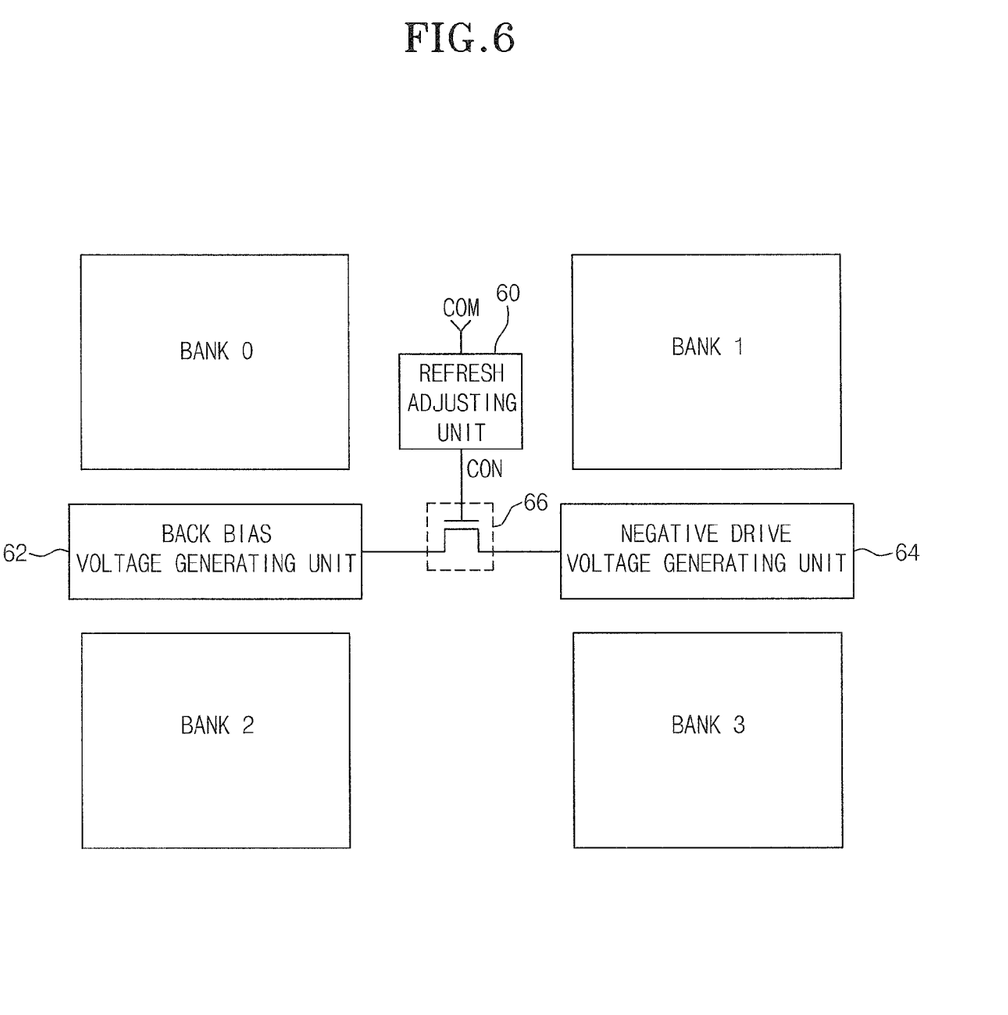
FIG. 6 is a block diagram illustrating an embodiment of a semiconductor memory device according to the present invention.

Referring to FIG. 6, the back bias voltage VBB and the negative voltage VNDS used for a pull-down drive of the sense amplifier can be supplied from the negative drive voltage generating unit 64. The relation of voltage sharing between the negative drive voltage generating unit 64 and the back bias voltage generating unit 62 (which supplies the back bias voltage VBB to the cell array) can be set selected according to different modes.

In FIG. 6, a refresh adjusting unit 60, a back bias voltage generating unit 62, a negative drive voltage generating unit 64, and a switching unit 66 are provided in regions between banks BANK1, BANK2, BANK3, and BANK4.

The refresh adjusting unit 60 supplies a mode control signal CON having a high or a low level in response to an external command COM, i.e., an active command or a refresh command. The back bias voltage generating unit 62 supplies the back bias voltage VBB necessary for the cell array. The negative drive voltage generating unit 64 supplies voltages used for the pull-up and pull-down drive of the sense amplifier. The mode control signal CON controls the switching unit 66, and the switching unit 66 is turned off in response to the active command and turned on in response to the refresh command. Herein, the negative drive voltage generating unit 64 generates the negative drive voltages including the normal pull-up voltage, the overdrive voltage, the normal pull-down voltage, and the negative voltage as a voltage having the same level as that of the back bias voltage. The negative drive voltage generating unit 64 supplies the negative drive voltages to the sense amplifier of the bank in accordance with the active mode.

In a 4-bank structure as shown in FIG. 6, typical active operation is performed in one bank, and thus the negative drive voltage is not greatly consumed. Accordingly, stable negative drive voltage can be supplied even though the negative drive voltage generating unit 64 is operated independently. At this time, the switching unit 66 is turned off to keep the negative drive voltage generating unit 64 from influencing the back bias voltage generating unit 62, so that the back bias voltage VBB is not changed.

The four banks are in the active state successively in a certain time interval during the refresh operation. The power consumption of the negative drive voltage generating unit 64 is great during this time interval. Therefore, in the refresh mode, the switching unit 66 is turned on to allow the back bias voltage generating unit 62 and the negative drive voltage generating unit 64 to share the back bias voltage VBB.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A sense amplifier, comprising:
   sense amplifier drive unit having a sense amplifying circuit including a pull-up activating terminal and a pull-down activating terminal, wherein the sense amplifying circuit performs a pull-up drive by a voltage applied to the pull-up activating terminal and a pull-down drive by a voltage applied to the pull-down activating terminal;
   a sense amplifier drive controller comprising:
      a pull-up drive controller applying a normal pull-up voltage and an overdrive voltage having a voltage level higher than that of the normal pull-up voltage to the pull-up activating terminal, as the voltage applied to the pull-up activating terminal and;
      a pull-down controller applying a normal pull-down voltage and a negative voltage having a voltage level less than that of the normal pull-down voltage to the pull-down activating terminal, as the voltage applied to the pull-down activating terminal.

2. The sense amplifier as set forth in claim 1, wherein:
   the pull-up drive control unit comprises:
      a first switching element switching the normal pull-up voltage according to a normal pull-up control signal; and
      a second switching element switching the overdrive voltage according to an overdrive control signal; and
   the pull-down drive control unit comprises:
      a third switching element switching the normal pull-down voltage according to a normal pull-down control signal; and
      a fourth switching element switching the negative voltage according to a negative drive control signal.

3. The sense amplifier as set forth in claim 1, wherein the normal pull-up control signal is a core voltage which is a high voltage of a bit line, the overdrive voltage is a power supply voltage or a high voltage boosted above the power supply voltage, and the normal pull-down supply voltage is a back bias voltage.

4. A method of driving a sense amplifier including a pull-up activating terminal and a pull-down activating terminal, comprising the steps of:
   activating a word line after a precharge state so that cell data is carried on a bit line;
   driving the sense amplifier in a normal pull-down drive state by applying a normal pull-down voltage to the pull-down activating terminal of the sense amplifier;
   driving the sense amplifier in a negative pull-down drive state by applying a negative voltage having a voltage level less than that of the normal pull-down voltage to the pull-down activating terminal of the sense amplifier driven in the normal pull-down drive state;
   overdriving the sense amplifier in an overdrive state by applying an overdrive voltage having a voltage level higher than that of a normal pull-up voltage to the pull-up activating terminal of the sense amplifier, wherein the steps of overdriving the sense amplifier and applying the negative voltage overlap;
   applying the normal pull-down voltage to the pull-down activating terminal of the sense amplifier driven in the negative pull-down drive state to change the sense amplifier to the normal pull-down drive state;
   applying the normal pull-up voltage to the pull-up activating terminal of the sense amplifier overdriven in the overdrive state to change the sense amplifier to a normal pull-up drive state; and
   returning to the precharge state after maintaining the normal pull-down drive state and the normal pull-up drive state for a predetermined period of time.

5. The method of claim 4, wherein a power supply voltage is supplied as the overdrive voltage, a core voltage which is a high voltage of the bit line is supplied as the normal pull-up voltage, and a back bias voltage is supplied as the normal pull-down voltage.

6. The driving method of claim 4, wherein a high voltage is supplied as the overdrive supply voltage, the core voltage is supplied as the normal pull-up voltage, and the back bias voltage is supplied as the normal pull-down voltage.

* * * * *